(12) United States Patent
Yokoyama et al.

(10) Patent No.: US 9,508,564 B2
(45) Date of Patent: Nov. 29, 2016

(54) METHOD FOR MANUFACTURING SEMICONDUCTOR DEVICE

(71) Applicant: Mitsubishi Electric Corporation, Tokyo (JP)

(72) Inventors: Yoshinori Yokoyama, Tokyo (JP); Kazuyo Endo, Tokyo (JP); Jun Fujita, Tokyo (JP); Shinnosuke Soda, Tokyo (JP); Kazuyasu Nishikawa, Tokyo (JP); Yoichi Nogami, Tokyo (JP); Yoshitsugu Yamamoto, Tokyo (JP); Akira Inoue, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/425,142

(22) PCT Filed: Jul. 19, 2013

(86) PCT No.: PCT/JP2013/069669
§ 371 (c)(1),
(2) Date: Mar. 2, 2015

(87) PCT Pub. No.: WO2014/045701
PCT Pub. Date: Mar. 27, 2014

(65) Prior Publication Data
US 2015/0243530 A1 Aug. 27, 2015

(30) Foreign Application Priority Data
Sep. 19, 2012 (JP) ................. 2012-205771

(51) Int. Cl.
*H01L 21/00* (2006.01)
*H01L 21/52* (2006.01)
(Continued)

(52) U.S. Cl.
CPC ............. *H01L 21/52* (2013.01); *H01L 21/50* (2013.01); *H01L 21/561* (2013.01); *H01L 21/78* (2013.01); *H01L 23/10* (2013.01); *H01L 2924/0002* (2013.01)

(58) Field of Classification Search
None
See application file for complete search history.

(56) References Cited

U.S. PATENT DOCUMENTS

2004/0061207 A1    4/2004  Ding

FOREIGN PATENT DOCUMENTS

| JP | 10 27860 | 1/1998 |
|---|---|---|
| JP | 3566508 | 9/2004 |

(Continued)

OTHER PUBLICATIONS

International Preliminary Report on Patentability and Written Opinion issued Apr. 2, 2015 in PCT/JP2013/069669 (English translation only).

(Continued)

*Primary Examiner* — Sonya D McCall Shepard
(74) *Attorney, Agent, or Firm* — Oblon, McClelland, Maier & Neustadt, L.L.P.

(57) ABSTRACT

A plurality of semiconductor element is formed on a substrate. A plurality of sealing windows and a support portion supporting the plurality of sealing windows are formed on a SOI substrate. The SOI substrate is pressured against the substrate by using a pressurizing member and the plurality of sealing windows of the SOI substrate is bonded to the substrate via a low melting point glass member arranged around the plurality of semiconductor elements. The support portion is separated from the plurality of sealing windows bonded to the substrate.

9 Claims, 6 Drawing Sheets

(51) Int. Cl.
*H01L 23/10* (2006.01)
*H01L 21/50* (2006.01)
*H01L 21/56* (2006.01)
*H01L 21/78* (2006.01)

(56) References Cited

FOREIGN PATENT DOCUMENTS

| | | |
|---|---|---|
| JP | 2006 501679 | 1/2006 |
| JP | 4385145 | 12/2009 |
| JP | 4619201 | 1/2011 |
| JP | 2011 220938 | 11/2011 |
| TW | 175564 | 12/1991 |
| WO | 2012 120694 | 9/2012 |

OTHER PUBLICATIONS

Combined Office Action and Search Report issued Apr. 20, 2015 in Taiwanese Patent Application No. 102131955 (with partial English translation of the Office Action and English translation of categories of cited documents).

International Search Report Issued Oct. 22, 2013 in PCT/JP13/069669 Filed Jul. 19, 2013.

Japanese Office Action issued Mar. 15, 2016 in Patent Application No. 2014-536651 (with partial English translation).

METHOD FOR MANUFACTURING SEMICONDUCTOR DEVICE

TECHNICAL FIELD

The present invention relates to a method for manufacturing a semiconductor device having a hollow hermetic sealing structure.

BACKGROUND ART

High-frequency semiconductor devices such as field-effect transistor elements using compound semiconductors like GaAs and GaN are rapidly being generalized and there is a strong demand for cost reduction. In order to respond to this demand, instead of totally sealed metal packages which have been used so far, low-priced mold packages are being adopted. However, when adopting non-sealed packages like mold packages, it is necessary to secure moisture resistance of semiconductor devices in order to prevent various kinds of deterioration attributable to moisture. For this reason, there is a demand for manufacturing semiconductor devices having a hollow hermetic sealing structure in which only necessary parts are sealed.

In conventional semiconductor devices, an insulating lid is bonded to a ceramic substrate on which a semiconductor element is mounted using glass to seal the semiconductor element (e.g., see Patent Literature 1). In this device, a dielectric constant of glass is 15 or below, a dielectric constant of the insulating lid is 15 or below and a difference in thermal expansion among the ceramic substrate, glass and lid is $1.2 \times 10^{-6}/°$ C. or below.

CITATION LIST

Patent Literature

Patent Literature 1: Japanese Patent No. 3566508 (p. 3, lines 35 to 46, FIG. 1)

SUMMARY OF INVENTION

Technical Problem

Semiconductor elements are conventionally sealed with an insulating lid one by one. For this reason, there has been a problem that despite a high-degree of air tightness, productivity is low and manufacturing cost is high.

The present invention has been implemented to solve the above-described problem, and it is an object of the present invention to provide a method for manufacturing a semiconductor device capable of reducing manufacturing cost while securing air tightness.

Means for Solving the Problems

A method for manufacturing a semiconductor device according to the present invention includes: forming a plurality of semiconductor elements on a first substrate; forming a plurality of sealing windows and a support portion supporting the plurality of sealing windows on a second substrate; pressing the second substrate against the first substrate by using a pressurizing member and bonding the plurality of sealing windows of the second substrate to the first substrate via a low melting point glass member arranged around the plurality of semiconductor elements; and separating the support portion from the plurality of sealing windows bonded to the first substrate.

Advantageous Effects of Invention

The present invention makes it possible to reduce manufacturing cost while securing air tightness.

DESCRIPTION OF EMBODIMENTS

A method for manufacturing a semiconductor device according to the embodiments of the present invention will be described with reference to the drawings. The same components will be denoted by the same symbols, and the repeated description thereof may be omitted.

Embodiment 1

Figure 1:
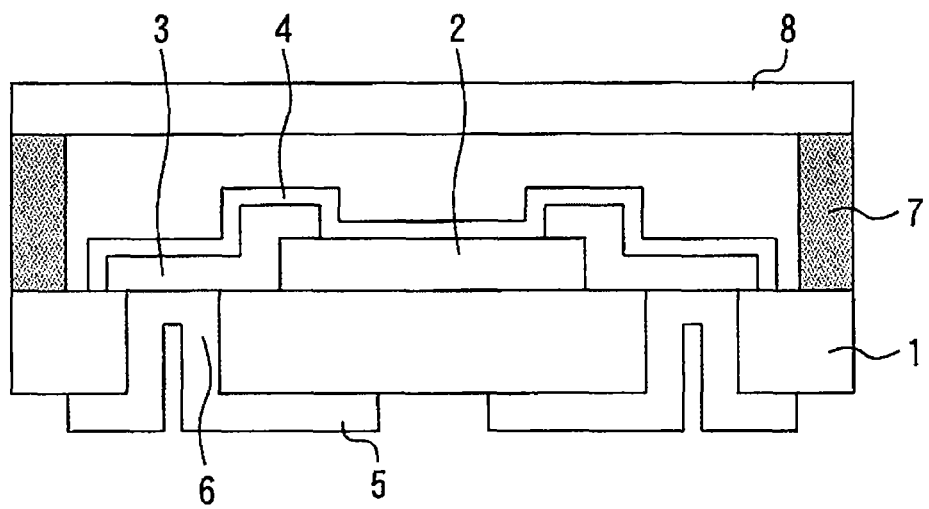
FIG. 1 is a cross-sectional view illustrating a semiconductor device according to Embodiment 1 of the present invention.

FIG. 1 is a cross-sectional view illustrating a semiconductor device according to Embodiment 1 of the present invention. A semiconductor element 2 is mounted on a substrate 1. The substrate 1 is a semiconductor substrate such as Si, GaAs, GaN, SiC or an insulating substrate such as sapphire or ceramic. The semiconductor element 2 is a field-effect transistor, but without being limited to this, the semiconductor element 2 can also be a bipolar transistor element or the like.

An electrode pad 3 is electrically connected to the semiconductor element 2. Examples of the electrode pad 3 include a gate pad, source pad and drain pad. The semiconductor element 2 is covered with a surface protective film 4 such as an SiN film formed by means of plasma CVD or the like. A back pad 5 is provided on the back surface of the substrate 1 and electrically connected to the electrode pad 3 via a through electrode 6 that penetrates the substrate 1. Although the back pad 5 is used here, without being limited to this, field-through wiring may also be used.

A low melting point glass member 7 is disposed around the sealed area including the semiconductor element 2 on the substrate 1. A sealing window 8 is bonded to the substrate 1 via the low melting point glass member 7 to seal the semiconductor element 2. The low melting point glass member 7 is made of, for example, vanadium-based glass.

The vanadium-based glass can be baked at 450° C. or below, has a high moisture-resistant material characteristic and has a black color tone. Bismuth-based glass, lead-based glass, lead fluorine-based glass or the like capable of baking at 400° C. or below may be used as the low melting point glass member 7.

Next, a method for manufacturing the semiconductor device according to the present embodiment will be described. FIGS. 2, 3, 4, 6, 8 and 9 are cross-sectional views for illustrating the method for manufacturing the semiconductor device according to Embodiment 1 of the present invention, and FIGS. 5 and 7 are top views for illustrating the method for manufacturing the semiconductor device according to Embodiment 1 of the present invention.

Figure 2:
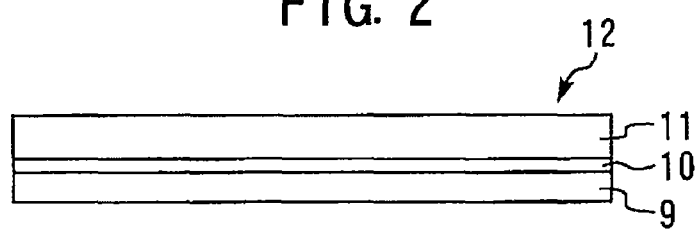
FIGS. 2, 3, 4, 6, 8 and 9 are cross-sectional views for illustrating the method for manufacturing the semiconductor device according to Embodiment 1 of the present invention.
Figure 3:
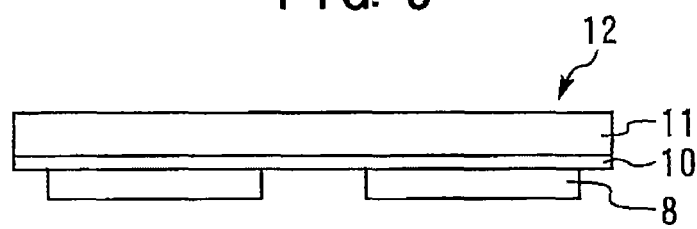

First, as shown in FIG. 2, a SOI substrate 12 is formed by laminating a Si layer 9, a $SiO_2$ layer 10 and a Si layer 11 on one another. Next, as shown in FIG. 3, unnecessary parts of the Si layer 9 are removed by dry etching, wet etching, half cut dicing or the like and a plurality of sealing windows 8 are formed. Even if some parts of the $SiO_2$ layer 10 and the Si layer 11 are removed in this case, it is alright if the respective layers are integrated as a single wafer.

Figure 4:
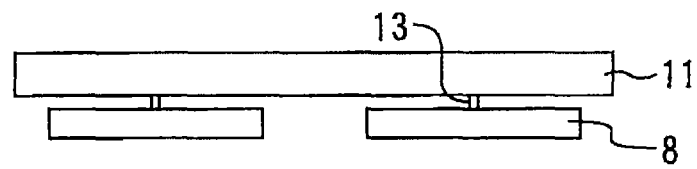
Figure 5:
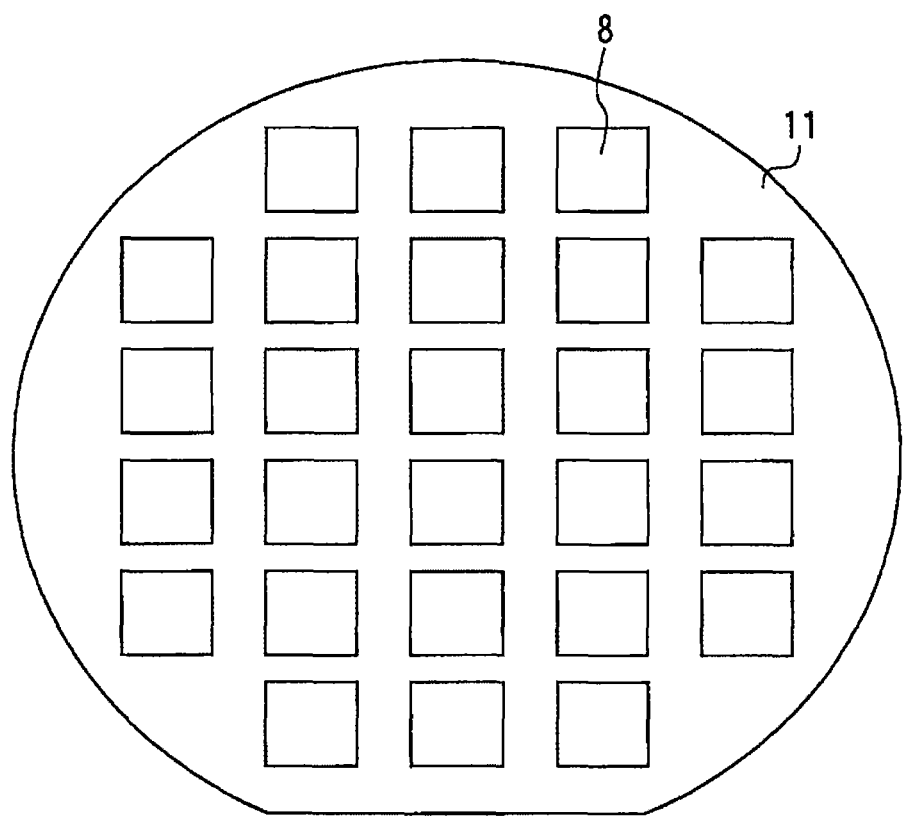
FIGS. 5 and 7 are top views for illustrating the method for manufacturing the semiconductor device according to Embodiment 1 of the present invention.

Next, as shown in FIG. 4, the $SiO_2$ layer 10 placed on the back surface of the sealing window 8 is etched with a vapor, liquid or the like of dilute hydrofluoric acid to form support portions 13 that support a plurality of sealing windows 8. The size of the support portion 13 is on the order of several μm to several hundreds of μm, and the smaller, the better as long as it can support the sealing window 8. Here, as shown in FIG. 5, 26 sealing windows 8 of the same size are arranged in a matrix form, but without being limited to this, the sealing windows 8 may vary in size, may not be arranged densely and may be arranged so that they can be separated element by element in posterior steps.

Figure 6:
Figure 7:
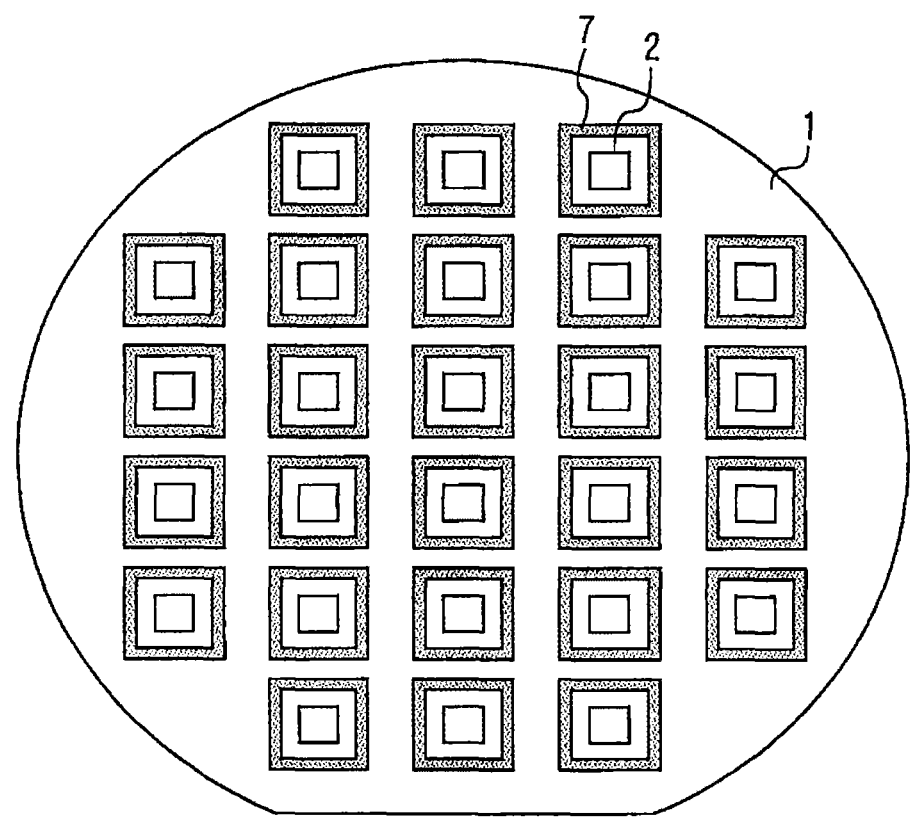

Next, as shown in FIG. 6 and FIG. 7, a plurality of semiconductor elements 2 are formed on the substrate 1, low melting point glass members 7 are applied around the plurality of semiconductor elements 2 using screen printing or a dispenser or the like. Next, far-infrared rays are radiated in vacuum to provisionally bake the low melting point glass member 7. By heating it in vacuum, it is possible to eliminate bubbles produced in the low melting point glass member 7. However, if bubbles in the low melting point glass member 7 are at a level that would not cause any problem in terms of air tightness, the low melting point glass member 7 need not be provisionally baked in vacuum, but may be provisionally baked in an atmosphere or nitrogen.

Here, the low melting point glass member 7 is applied to the substrate 1, but it may also be applied to the sealing window 8. In that case, the low melting point glass member 7 is provisionally baked on the SOI substrate 12 including the sealing window 8. The low melting point glass member 7 is applied before forming the support portion 13. However, when the support portion 13 has sufficient strength, the low melting point glass member 7 may be applied after forming the support portion 13.

Figure 8:
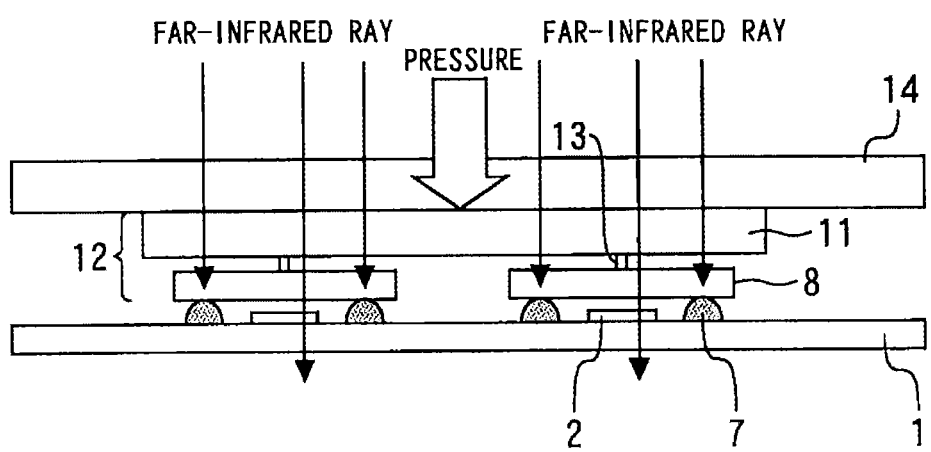

Next, as shown in FIG. 8, the plurality of sealing windows 8 of the SOI substrate 12 are aligned on the plurality of semiconductor elements 2 on the substrate 1. Using a pressurizing member 14, the SOI substrate 12 is pressed against the substrate 1 and the plurality of sealing windows 8 of the SOI substrate 12 are bonded to the substrate 1 via the low melting point glass members 7 arranged around the plurality of semiconductor elements 2. In this case, the low melting point glass member 7 is selectively heated and melted by far-infrared rays. Here, the pressurizing member 14 is made of a material that allows far-infrared rays to pass therethrough and the low melting point glass member 7 has a higher far-infrared ray absorption rate than the plurality of semiconductor elements 2 and sealing windows 8. When the steps from alignment to sealing are performed in the atmosphere, sealing is done in the atmosphere, whereas when the steps are performed in a dry air or nitrogen atmosphere, sealing is done in such an atmosphere, and when the steps are performed in vacuum, vacuum sealing can be done.

Figure 9:
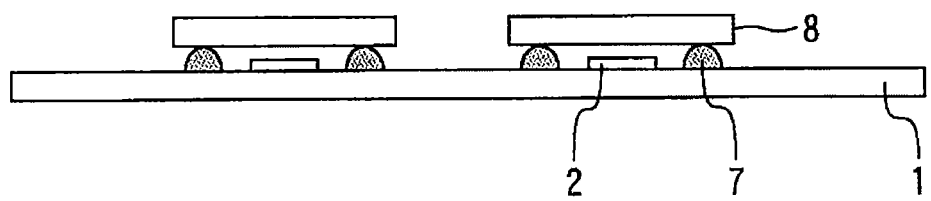

Moreover, the support portions 13 are broken by pressurizing the entire surface of the SOI substrate 12 by the pressurizing member 14 at several MPa to several tens of MPa. As shown in FIG. 9, the support portions 13 are separated from the plurality of sealing windows 8 bonded to the substrate 1. Then, the substrate 1 is divided into pieces, each piece corresponding to each semiconductor element 2. In the steps described so far, the semiconductor device according to the present embodiment is manufactured.

Since the semiconductor element 2 is sealed with the low melting point glass member 7 and the sealing window 8 in the present embodiment, air tightness can be secured. The plurality of semiconductor elements 2 on the substrate 1 are collectively sealed with the plurality of sealing windows 8 integrated with the SOI substrate 12 in a wafer state, making it possible to improve productivity and reduce manufacturing cost.

Furthermore, when the plurality of sealing windows 8 are bonded to the substrate 1, the low melting point glass members 7 are selectively heated and melted using far-infrared rays. In this way, it is possible to melt the low melting point glass member 7 while avoiding an excessive temperature rise of the semiconductor element 2, and thereby secure excellent moisture resistance with respect to the semiconductor element 2. For example, even if the heat-resisting temperature of the semiconductor element 2 is merely on the order of 250° C., it is possible to prevent thermal destruction.

The low melting point glass member 7 has a higher far-infrared ray absorption rate than the semiconductor element 2 and sealing window 8. Thus, even when the entire substrate is irradiated with far-infrared rays, it is possible to selectively heat the low melting point glass member 7 without causing a temperature rise of the semiconductor element 2 having a low absorption rate. For example, Si allows nearly 60% of far-infrared rays having a wavelength of 3 μm to 5 μm to pass therethrough, while carbon absorbs approximately 90% of far-infrared rays. When a difference in the far-infrared ray absorption rate between the black vanadium-based low melting point glass member 7 and the substrate 1 is on the order of 40%, it is possible to selectively heat the low melting point glass member 7.

Table 1 illustrates Young's moduli and thermal expansion coefficients of various materials. Table 2 illustrates amounts of curvature [μm] measured when strip-shaped substrates (length 4 mm, thickness 0.1 mm) of various materials are pasted to each other, one side thereof is fixed and the temperature is changed by 200 degrees.

TABLE 1

|  | Young's modulus [GPa] | Thermal expansion coefficient [×10$^{-6}$/K] |
| --- | --- | --- |
| Si | 130 | 2.4 |
| SiC | 430 | 4.68 |
| GaN | 181 | 5.59 |
| Pyrex (registered trademark) | 61 | 3.25 |
| Non-alkali glass | 77 | 3.8 |

TABLE 1-continued

|  | Young's modulus [GPa] | Thermal expansion coefficient [×10⁻⁶/K] |
|---|---|---|
| Soda lime glass | 71 | 8.5 |
| Vanadium-based glass | 53 | 6.0 |

TABLE 2

|  | Pyrex (registered trademark) | Non-alkali glass | Soda lime glass | Vanadium-based glass |
|---|---|---|---|---|
| Si | 9.8 | 17 | 72 | 41 |
| SiC | 13 | 8.5 | 36 | 11 |
| GaN | 26 | 20 | 33 | 4.4 |

Since materials having amounts of curvature exceeding 50 µm cannot be used due to mounting-related problems or the like, the difference in coefficient of linear expansion between the sealing window 8 and the substrate 1 needs to be $4.3 \times 10^{-6}$ [/K] or below. For example, when the substrate 1 is Si, the material of the sealing window 8 may be glass or the like which is similar to Si in a coefficient of linear expansion, but producing the sealing window 8 using Si as with the substrate 1 is more preferable because this can reduce the problem related to curvature or the like even when the thickness of the substrate 1 is reduced. The same applies to cases where the substrate 1 is a semiconductor substrate such as SiC, GaAs, GaN or an insulating substrate such as sapphire, ceramic. Therefore, the material of the sealing window 8 is preferably the same as the material of the substrate 1 or a material whose difference in coefficient of linear expansion from the substrate 1 is $4.3 \times 10^{-6}$ [/K] or below.

Figure 10:
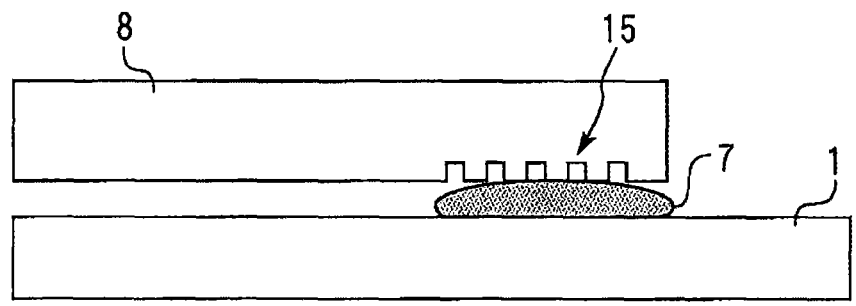
FIG. 10 is an enlarged cross-sectional view illustrating a modification of the semiconductor device according to Embodiment 1 of the present invention.

FIG. 10 is an enlarged cross-sectional view illustrating a modification of the semiconductor device according to Embodiment 1 of the present invention. A concavo-convex portion 15 is provided in an area where the sealing window 8 comes into contact with the low melting point glass member 7. Since the low melting point glass member 7 goes into the concavo-convex portion 15 when pressurizing sealing is applied, bonding strength improves. Similar effects can be obtained also when the substrate 1 is provided with a concavo-convex portion. The size of the concavo-convex portion 15 varies depending on the viscosity of the low melting point glass member 7, and for example, it ranges from several µm to several tens of µm. The ratio between the width and depth of the concavo-convex portion 15 preferably does not exceed 1:1. Instead of the concavo-convex portion 15, rough finish may be applied to the bonding surface to increase the bonded area. Providing on the bonded surface, a material having high affinity for the low melting point glass member 7, for example, SiN, Si, Al, SUS, Ni, AlN further improves bonding strength.

Embodiment 2

Figure 11:
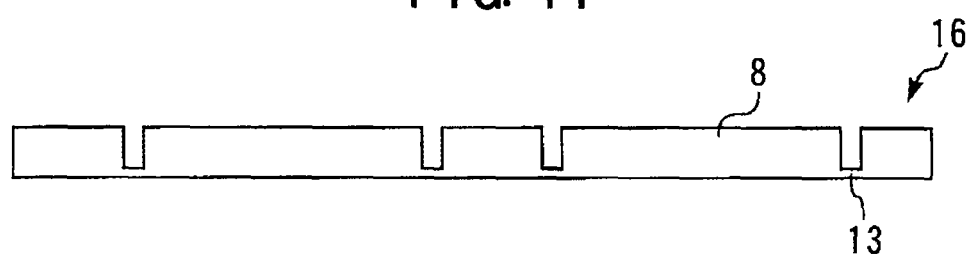
FIG. 11 and FIG. 13 are cross-sectional views for illustrating a method of manufacturing a semiconductor device according to Embodiment 2 of the present invention.
Figure 12:
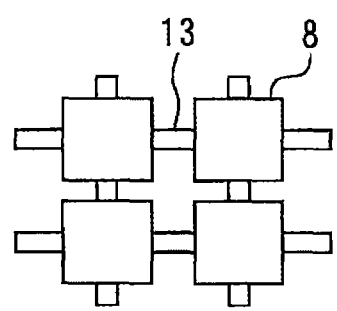
FIG. 12 is an enlarged top view for illustrating the method of manufacturing a semiconductor device according to Embodiment 2 of the present invention.
Figure 13:
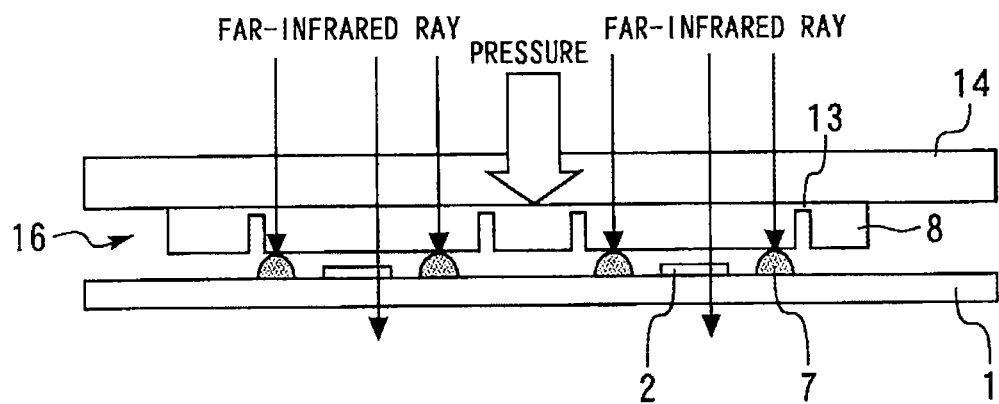

FIG. 11 and FIG. 13 are cross-sectional views for illustrating a method of manufacturing a semiconductor device according to Embodiment 2 of the present invention and FIG. 12 is an enlarged top view for illustrating the method of manufacturing a semiconductor device according to Embodiment 2 of the present invention.

As shown in FIG. 11, a plurality of sealing windows 8 and support portions 13 that support the plurality of sealing windows 8 are formed on a substrate 16 by removing unnecessary parts of the substrate 16 by half cut dicing, dry etching or wet etching or the like. As shown in FIG. 12, the support portions 13 need not be left all around the sealing window 8. The size of the support portion 13 is on the order of several µm to several hundreds of µm, and the smaller, the better as long as it can support the sealing window 8. For example, in Pyrex (registered trademark) glass anodically bonded to Si, when there is a bonded region of 0.5 mm×0.5 mm and a non-bonded region of 0.3 mm in width, the device was ruptured with a load of 1 N. That is, it was possible to rupture a portion having a residual of 0.2 mm under a pressure of 10 MPa.

Next, as with Embodiment 1, a plurality of semiconductor elements 2 are formed on the substrate 1, and the plurality of semiconductor elements 2 are subjected to provisional baking with the low melting point glass member 7 applied therearound.

Next, as shown in FIG. 13, the plurality of sealing windows 8 of the substrate 16 are aligned above the plurality of semiconductor elements 2 on the substrate 1. The substrate 16 is pressed against the substrate 1 using the pressurizing member 14 and the plurality of sealing windows 8 of the substrate 16 are bonded to the substrate 1 via the low melting point glass members 7 arranged around the plurality of semiconductor elements 2. In this case, the low melting point glass member 7 is selectively heated and melted with far-infrared rays. The support portions 13 are broken by pressurizing the entire surface of the substrate 16 using the pressurizing member 14 at several MPa to several tens of MPa. The support portions 13 are separated from the plurality of sealing windows 8 bonded to the substrate 1, and in this way the semiconductor device according to the present embodiment is manufactured.

As with Embodiment 1, the present embodiment can reduce manufacturing cost while securing air tightness. By selectively heating and melting the low melting point glass member 7 using far-infrared rays, it is possible to melt the low melting point glass member 7 while avoiding an excessive temperature rise of the semiconductor element 2.

Embodiment 3

Figure 14:
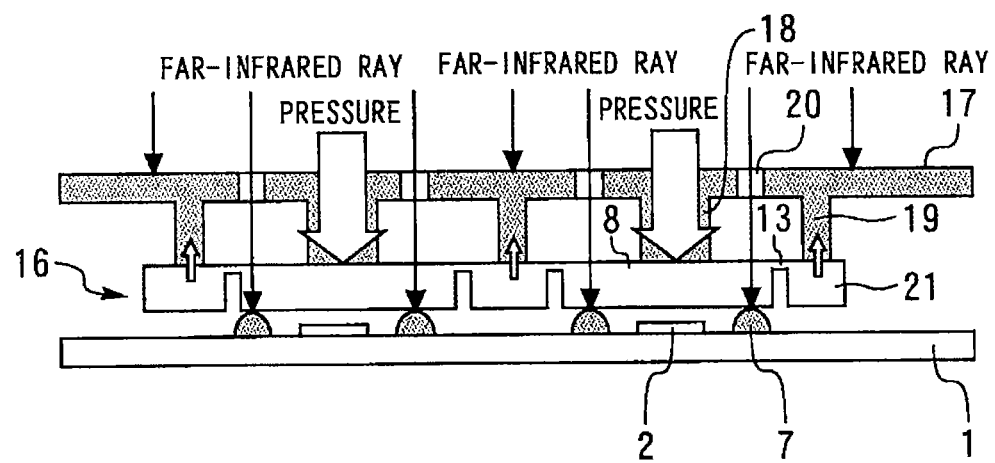
FIG. 14 is a cross-sectional view illustrating a method for manufacturing a semiconductor device according to Embodiment 2 of the present invention.

FIG. 14 is a cross-sectional view illustrating a method for manufacturing a semiconductor device according to Embodiment 2 of the present invention. In Embodiments 1 and 2, the pressurizing member 14 that allows far-infrared rays to pass therethrough is used, whereas a pressurizing member 17 according to the present embodiment is made of a material such as SUS, ceramic, copper that does not allow far-infrared rays to pass therethrough, and the device includes a protrusion 18, a suctioning mechanism 19 and an opening 20.

As shown in FIG. 14, the substrate 16 is pressed against the substrate 1 by the protrusion 18 of the pressurizing member 17 and the plurality of sealing windows 8 of the substrate 16 are bonded to the substrate 1 via the low melting point glass members 7 arranged around the plurality of semiconductor elements 2.

In this case, the support portions 13 are broken by causing the protrusion 18 of the pressurizing member 17 to pressurize the sealing window 8 of the substrate 16. An unnecessary portion 21 after the cutting are suctioned by the suctioning mechanism 19 and removed. The suctioning mechanism 19 performs suctioning or the like using vacuum suctioning, an adhesive member or gel substance. The support portions 13 may be broken by pressurizing the unnecessary portion 21 around the sealing window 8.

The low melting point glass member 7 is selectively irradiated and melted with far-infrared rays via the opening 20 of the pressurizing member 17. The protrusion 18 for pressurizing also has a role of covering the substrate 1 from far-infrared rays and preventing a temperature rise. It is thereby possible to prevent an excessive temperature rise of the semiconductor element 2 even when the substrate 1 has a high far-infrared ray absorption rate. Other steps and effects are the same as those in Embodiments 1 and 2.

In the present embodiment, the low melting point glass member 7 is selectively irradiated with far-infrared rays using the pressurizing member 17 as a mask, but the substrate 16 may be configured to have a lens shape (not shown) and the low melting point glass member 7 may be selectively irradiated with far-infrared rays. Moreover, the pressurizing member 17 may be coated with a reflection film so as to cover regions other than the low melting point glass member 7.

DESCRIPTION OF SYMBOLS 1 substrate (first substrate); 2 semiconductor element; 7 low melting point glass member; 8 sealing window; 9 first Si layer; 10 SiO$_2$ layer; 11 second Si layer; 12 SOI substrate (second substrate); 13 support portion; 14, 17 pressurizing member; 16 substrate (second substrate); 20 opening

The invention claimed is:

1. A method for manufacturing a semiconductor device comprising:
    forming a plurality of semiconductor elements on a first substrate;
    forming a plurality of sealing windows and a support portion supporting the plurality of sealing windows on back surfaces of the plurality of sealing windows on a second substrate;
    pressing the second substrate against the first substrate by using a pressurizing member and bonding the plurality of sealing windows of the second substrate to the first substrate via a low melting point glass member arranged around the plurality of semiconductor elements; and
    breaking and separating, by a pressure of the pressurizing member, the support portion from the back surfaces of the plurality of sealing windows bonded to the first substrate.

2. The method for manufacturing the semiconductor device according to claim 1, wherein when the plurality of sealing windows are bonded to the first substrate, the low melting point glass member is selectively heated and melted using far-infrared rays.

3. The method for manufacturing the semiconductor device according to claim 2, wherein the low melting point glass member has a higher far-infrared ray absorption rate than the plurality of semiconductor elements and the sealing windows.

4. The method for manufacturing the semiconductor device according to claim 2, wherein the pressurizing member is made of a material that does not allow far-infrared rays to pass therethrough, and includes an opening, and
    the low melting point glass member is selectively irradiated with far-infrared rays via the opening of the pressurizing member.

5. The method for manufacturing the semiconductor device according to claim 1, wherein a material of the sealing windows is the same as a material of the first substrate or a material whose difference in coefficient of linear expansion from the first substrate is $4.3\times10^{-6}$[/K] or below.

6. The method for manufacturing the semiconductor device according to claim 1, wherein the second substrate is a SOI substrate formed by laminating a first Si layer, a SiO$_2$ layer, and a second Si layer on one another,
    an unnecessary part of the first Si layer is removed to form the plurality of sealing windows, and
    the SiO$_2$ layer placed on back surfaces of the plurality of sealing windows is etched to form the support portion.

7. The method for manufacturing the semiconductor device according to claim 1, wherein the plurality of sealing windows and the support portion are formed by removing an unnecessary part of the second substrate by half cut dicing, dry etching or wet etching.

8. The method for manufacturing the semiconductor device according to claim 2, wherein the pressurizing member is made of a material that allows far-infrared rays to pass therethrough, and
    the low melting point glass member is selectively irradiated with far-infrared rays via the pressurizing member.

9. The method for manufacturing the semiconductor device according to claim 1, wherein a time for arranging the low melting point glass member is based on a determined strength of the formed support portion.

* * * * *